US009086069B2

(12) United States Patent
Dede

(10) Patent No.: US 9,086,069 B2
(45) Date of Patent: Jul. 21, 2015

(54) COOLING APPARATUSES, ELECTRONIC DEVICE ASSEMBLIES, AND COOLING ASSEMBLIES USING MAGNETIC SHAPE MEMORY MEMBERS

(71) Applicant: Toyota Motor Engineering & Manufacturing North America, Inc., Erlanger, KY (US)

(72) Inventor: Ercan Mehmet Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 14/186,212

(22) Filed: Feb. 21, 2014

(65) Prior Publication Data

US 2014/0168894 A1    Jun. 19, 2014

Related U.S. Application Data

(63) Continuation of application No. 13/358,219, filed on Jan. 25, 2012, now Pat. No. 8,681,496.

(51) Int. Cl.
*H05K 7/20*         (2006.01)
*F04D 25/02*        (2006.01)
(Continued)

(52) U.S. Cl.
CPC .......... *F04D 25/026* (2013.01); *F04D 25/0606* (2013.01); *F04D 33/00* (2013.01); *H05K 7/20172* (2013.01)

(58) Field of Classification Search
CPC .......... H05K 7/20; H05K 7/203; F04D 25/02; F04D 25/026; F04D 25/0606
USPC ...................... 361/679.47, 679.48, 690–697, 361/704–712; 165/80.2, 80.3, 121–126, 165/104.33; 416/81, 132 A, 223 A, 229 A; 417/53, 322, 423.1, 423.7, 423.12, 417/423.14
See application file for complete search history.

(56) References Cited

U.S. PATENT DOCUMENTS

| 4,063,826 A | 12/1977 | Riepe |
| 4,498,851 A | 2/1985 | Kolm et al. |

(Continued)

FOREIGN PATENT DOCUMENTS

| JP | 61277898 | 12/1986 |
| JP | 403276698 | 12/1991 |

(Continued)

OTHER PUBLICATIONS

Goodfellow Corporation, http://www.goodfellowusa.com/corporate/news/US/June-2011/us.htm.

(Continued)

*Primary Examiner* — Michail V Datskovskiy
(74) *Attorney, Agent, or Firm* — Dinsmore & Shohl LLP

(57) ABSTRACT

Cooling apparatuses, electronic device assemblies, and cooling assemblies having a magnetic shape memory member are disclosed. In one embodiment, a cooling apparatus includes a first compliant member, a magnetic shape memory member, a magnetic field generating device, a second compliant member and a fan member. A first end of the magnetic shape memory member is coupled to the first compliant member. The magnetic field generating device is positioned proximate the magnetic shape memory member, and generates a magnetic field toward the magnetic shape memory member to cause the magnetic shape memory member to expand along a linear translation axis. Expansion of the magnetic shape memory member causes an actuated portion of the second compliant member to translate about an axis. The fan member is coupled to the actuated portion of the compliant member such that translation of the actuated portion translates the fan member.

20 Claims, 3 Drawing Sheets

(51) Int. Cl.
*F04D 25/06* (2006.01)
*F04D 33/00* (2006.01)
F04D 29/38 (2006.01)
F04B 35/00 (2006.01)

(56) References Cited

U.S. PATENT DOCUMENTS

| | | | |
|---|---|---|---|
| 4,595,338 A * | 6/1986 | Kolm et al. | 416/81 |
| 4,780,062 A | 10/1988 | Yamada et al. | |
| 4,834,619 A | 5/1989 | Walton | |
| 4,923,000 A | 5/1990 | Nelson | |
| 5,488,255 A | 1/1996 | Sato et al. | |
| 5,522,712 A * | 6/1996 | Winn | 417/436 |
| 5,861,703 A | 1/1999 | Losinski | |
| 6,043,978 A * | 3/2000 | Mody et al. | 361/690 |
| 6,628,522 B2 | 9/2003 | Trautman et al. | |
| 6,740,994 B2 * | 5/2004 | Lee et al. | 310/63 |
| 7,336,486 B2 | 2/2008 | Mongia | |
| 7,371,052 B2 | 5/2008 | Koeneman | |
| 7,578,661 B2 | 8/2009 | Koeneman | |
| 7,619,894 B2 * | 11/2009 | Wang et al. | 361/719 |
| 7,964,290 B2 * | 6/2011 | Mullner et al. | 428/613 |
| 8,016,952 B2 | 9/2011 | Ishida et al. | |
| 2011/0150669 A1 | 6/2011 | Frayne et al. | |

FOREIGN PATENT DOCUMENTS

| | | |
|---|---|---|
| JP | 406033895 | 2/1994 |
| JP | 2003276698 | 10/2003 |
| JP | 2008138558 | 6/2008 |
| JP | 2009162233 | 7/2009 |

OTHER PUBLICATIONS

Christopher P. Henry, "Dynamic Actuation Properties of Ni—Mn—Ga Ferromagnetic Shape Memory Alloys", submitted to the Massachusetts Institute of Technology Department of Materials Science and Engineering on May 22, 2002, images on pp. 64-66.

S. Sherrit, et al., "Planar rotary motor using ultrasonic horns", Proc. of SPIE, vol. 7981, 798100-1, Apr. 13, 2011.

Goodfellow Corporation, http://www.goodfellowusa.com/larger-quantities/alloys/magnetic-shape-memory-material, accessed Jan. 23, 2012.

* cited by examiner

COOLING APPARATUSES, ELECTRONIC DEVICE ASSEMBLIES, AND COOLING ASSEMBLIES USING MAGNETIC SHAPE MEMORY MEMBERS

CROSS-REFERENCE TO RELATED APPLICATIONS

This application is a continuation of U.S. patent application Ser. No. 13/358,219, filed on Jan. 25, 2012.

TECHNICAL FIELD

The present specification generally relates to cooling apparatuses, and more particularly, to cooling apparatuses, electronic device assemblies, and cooling assemblies that use a magnetic shape memory member as a linear actuator to drive a fan member to create airflow.

BACKGROUND

Power electronics devices are often utilized in high-power electrical applications, such as inverter systems for hybrid electric vehicles and electric vehicles. Power semiconductor devices such as power IGBTs and power transistors, for example, may be thermally coupled to a cooling structure (e.g., a heat spreader and/or a heat sink), to remove non-uniform heat fluxes generated by the power semiconductor devices. Operation of the power semiconductor devices may generate high thermal loads. Power semiconductor devices are demanding increased thermal management performance of cooling structures.

Some cooling structures may use fans to increase airflow toward the power semiconductor device to cool the power semiconductor by forced convection. Most systems utilize electrical motor coupled with fan blades or propellers to generate airflow. However, such electrical motors may have many moving parts and may be inefficient.

Accordingly, a need exists for alternative cooling apparatuses, electronic device assemblies, and cooling assemblies that have a linear actuator with increased strain and energy density to efficiently generate airflow toward a heat generating device.

SUMMARY

In one embodiment, a cooling apparatus includes a first compliant member, a magnetic shape memory member, a magnetic field generating device, a second compliant member and a fan member. The magnetic shape memory member includes a first end and a second end, wherein the first end of the magnetic shape memory member is coupled to a surface of the first compliant member. The magnetic field generating device is positioned proximate to the magnetic shape memory member, and is capable of generating a magnetic field toward the magnetic shape memory member such that the magnetic field causes the magnetic shape memory member to expand along a linear translation axis. The second compliant member includes a fixed surface and an actuated portion, wherein expansion of the magnetic shape memory member causes the actuated portion to translate about an axis defined by the fixed surface. The fan member includes a first end and a second end, wherein the first end of the fan member is coupled to the actuated portion of the second compliant member such that translation of the actuated portion translates the second end of the fan member.

In another embodiment, an electronic device assembly includes a cooling apparatus positioned proximate to a heat generating device. The cooling apparatus includes a first compliant member, a magnetic shape memory member, a magnetic field generating device, a second compliant member and a fan member. The magnetic shape memory member includes a first end and a second end, wherein the first end of the magnetic shape memory member is coupled to a surface of the first compliant member. The magnetic field generating device is positioned proximate to the magnetic shape memory member, and is capable of generating a magnetic field toward the magnetic shape memory member such that the magnetic field causes the magnetic shape memory member to expand along a linear translation axis. The second compliant member includes a fixed surface and an actuated portion, wherein expansion of the magnetic shape memory member causes the actuated portion to translate about an axis defined by the fixed surface. The fan member includes a first end and a second end, wherein the first end of the fan member is coupled to the actuated portion of the second compliant member such that translation of the actuated portion translates the second end of the fan member to generate an airflow toward the heat generating device.

In yet another embodiment, a cooling assembly includes a plurality of cooling apparatuses, and a gear member rotatably coupled to a propeller device. Each cooling apparatus of the plurality of cooling apparatuses includes a first compliant member, a magnetic shape memory member, a magnetic field generating device, a second compliant member and a fan member. The magnetic shape memory member includes a first end and a second end, wherein the first end of the magnetic shape memory member is coupled to a surface of the first compliant member. The magnetic field generating device is positioned proximate to the magnetic shape memory member, and is capable of generating a magnetic field toward the magnetic shape memory member such that the magnetic field causes the magnetic shape memory member to expand along a linear translation axis. The second compliant member includes a fixed surface and an actuated portion, wherein expansion of the magnetic shape memory member causes the actuated portion to translate about an axis defined by the fixed surface. The fan member includes a first end and a second end, wherein the first end of the fan member is coupled to the actuated portion of the second compliant member such that translation of the actuated portion translates the second end of the fan member. The gear member includes a plurality of gear teeth. The plurality of cooling apparatuses are arranged such that the fan members of the plurality of cooling apparatuses extend radially inward toward the gear member, and the second end of each fan member contacts the plurality of gear teeth when the magnetic shape memory member is actuated. Expansion of the magnetic shape memory member of each individual cooling apparatus of the plurality of cooling apparatuses cause the second end of the fan member of each individual cooling device of the plurality of cooling apparatuses to push on respective gear teeth to rotate the gear member and an actuated portion of the propeller device.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the appended figures, embodiments of the present disclosure are directed to cooling apparatuses that utilize one or more magnetic shape memory actuators to oscillate a fan member, such as a propeller or blade, to generate airflow toward a heat generating device, such as a power semiconductor device assembly. More particularly, embodiments utilize a ferromagnetic shape memory material as a linear actuator coupled to a compliant member. The compliant member is coupled to a fan member, such that oscillation of the compliant member causes motion of the fan member to create air flow toward the heat generating device for enhanced convective cooling. Various embodiments of cooling apparatuses, electronic device assemblies, and cooling assemblies will be described in more detail herein.

Figure 1A:
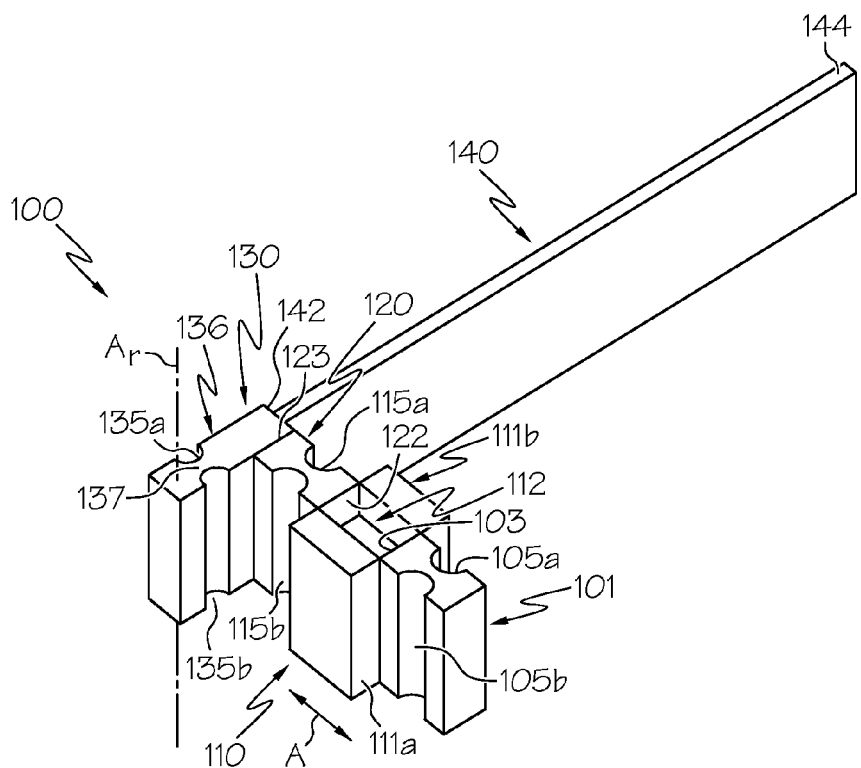
FIG. 1A schematically depicts a cooling apparatus according to one or more embodiments shown and described herein.

Referring initially to FIG. 1A, a cooling apparatus 100 according to one embodiment is schematically illustrated. The cooling apparatus 100 generally comprises a first compliant member 101, a magnetic shape memory member 112, a magnetic field generating device 110, a second compliant member 130, a third compliant member 120, and a fan member 140. It should be understood that embodiments are not limited to the configuration of the cooling apparatus 100 schematically illustrated in FIG. 1A as other configurations are also possible. As described in more detail below, the cooling apparatus 100 may be a component of a larger assembly that includes a heat generating device (e.g., a semiconductor device) that is cooled by the actuation of the cooling apparatus 100.

The first compliant member 101 may comprise a fixed surface 102 that is rigidly fixed to a base portion or support (not shown in FIG. 1A) that supports the components of the cooling apparatus 100. The first compliant member 101 may also comprise a coupling surface 103 that is coupled to a first end of the magnetic shape memory member 112. Accordingly, the first compliant member 101 provides structure to support the magnetic shape memory member 112 such that expansion of the magnetic shape memory member 112 occurs linearly toward the second compliant member 130 along a linear translation axis A, as described in more detail below. The first compliant member 101 should exhibit some deformation during actuation of the magnetic shape memory member 112. Any material with a suitable compliance may be chosen for the first compliant member 101. The first compliant member 101 may optionally comprise grooves 105a and 105b that may be used to form a portion of reduced thickness to increase the flexibility of the first compliant member 101. In an alternative embodiment, the first compliant member 101 does not include the grooves 105a, 105b but is rectangular in shape. It should be understood that the first compliant member 101 may take on other geometric configurations.

The magnetic shape memory member 112 comprises a strip of a ferromagnetic shape memory material, such as Ni—Mn—Ga, Ni—Mn—In—Co, and Ni—Fe—Ga—Co alloys, as well as magnetic shape memory polymer composites. The magnetic shape memory member 112 may be made of any known or yet-to-be-developed ferromagnetic shape memory material. The magnetic shape memory member 112 may have a high strain output and energy density, and exhibit reversible deformation along the linear translation axis A when subjected to a magnetic field source or elastic restorative force. In this manner, the magnetic shape memory member 112 may act as a linear actuator to cause movement of the fan member 140.

A first end of the magnetic shape memory member 112 is coupled to the coupling surface 103 of the first compliant member 101 such that the magnetic shape memory member 112 may push off of the first compliant member 101 when it expands. The first compliant member 101 may flex as the magnetic shape memory member 112 expands (e.g., about an axis defined by grooves 105a and 105b). A second end of the magnetic shape memory member 112 may be coupled to a first surface 122 of the third compliant member 120. A second surface 123 of the third compliant member 120 may be coupled to an actuated portion 136 of the second compliant member 130. Any material with a suitable compliance may be chosen for the third compliant member 120. The third compliant member 120 may also comprise optional grooves 115a, 115b to increase flexibility, as described above with respect to the first compliant member 101. In an alternative embodiment, a third compliant member 120 is not provided such that the second end of the magnetic shape memory member 112 is coupled directly to the actuated portion 136 of the second compliant member 130.

Located near the magnetic shape memory member 112 is the magnetic field generating device 110, which is configured to generate a magnetic field to controllably expand the magnetic shape memory member 112. The magnetic field generating device 110 should be positioned near the magnetic shape memory member 112 such that the magnetic field is incident upon the magnetic shape memory member 112. In the illustrated embodiment, the magnetic field generating device 110 comprises first and second magnetic field source poles 111a and 111b. The first and second magnetic field source poles 111a, 111b are configured to produce one or more magnetic fields that expand the magnetic shape memory member 112. It is noted that the spring force provided by the first, second and third compliant members 130 return the magnetic shape memory member 112 to its original shape upon removal of the magnetic field. In an alternative embodiment, two additional magnetic field poles may be provided to produce a return magnetic field that is 90 degrees with respect to the magnetic field produced by first and second magnetic field source poles 111a and 111b.

In one embodiment, the first and second magnetic field source poles 111a, 111b are configured as controllable electromagnets. The magnetic field generating device 110 may also take on other configurations, and may be configured as any device that generates magnetic fields that control the amplitude and frequency of the deformation of the magnetic shape memory member 112. In one embodiment, the sides of the magnetic shape memory member 112 slightly contact the first and second magnetic field source poles 111a, 111b to maintain the deformation of the magnetic shape memory member 112 along the linear translation axis A only.

As stated above, the magnetic shape memory member 112 is coupled to the actuated portion 136 of the second compliant member 130 either directly or indirectly via the third compliant member 120. The second compliant member 130 may also comprise a fixed surface 134 that is coupled to the same base portion or support as the first compliant member 101. The second compliant member 130 may be configured as a flexible monolithic structure that is capable of being deformed with elastic restorative force such that the actuated portion 136 moves about an axis of rotation $A_r$ defined by the fixed surface 134. In one embodiment, the second compliant member 130 comprises two opposing grooves 135a, 135b that form a portion of reduced thickness 137 that is located between the fixed surface 134 and the actuated portion 136. The portion of reduced thickness 137 may increase the flexibility of the second compliant member 130 for movement about the axis of rotation $A_r$. Other embodiments may not incorporate such grooves and portion of reduced thickness. Further, embodiments described herein are not limited to the geometric configuration of the second compliant member 130 illustrated in FIG. 1A. As The second compliant member 130 (as well as the first and third compliant members 101, 120) may be made of any material having elasticity with a low hysteresis capable of oscillating the fan member 140 at a desired amplitude and frequency. Exemplary materials include, but are not limited to, polypropylene, nylon, polyesters, elastomers having low hysteresis, nickel, steel, and copper.

The fan member 140 may comprise a first end 142 that is coupled to the second compliant member 130 and a second end 144 that is opposite from the first end 142. The fan member 140 may be configured as a simple beam that is linearly actuated at resonance to produce high airflow rates toward a heat generating device to be cooled. In other embodiments, the fan member 140 may have a more complicated profile, such as having multiple blades or an optimized shape for increased airflow, for example. The fan member 140 may be made from a wide variety of materials, such as polymers and metal materials. In an alternative embodiment, the fan member 140 is directly coupled to the magnetic shape memory member 112 or the third compliant member 120 without the use of a second compliant member 130.

Figure 1B:
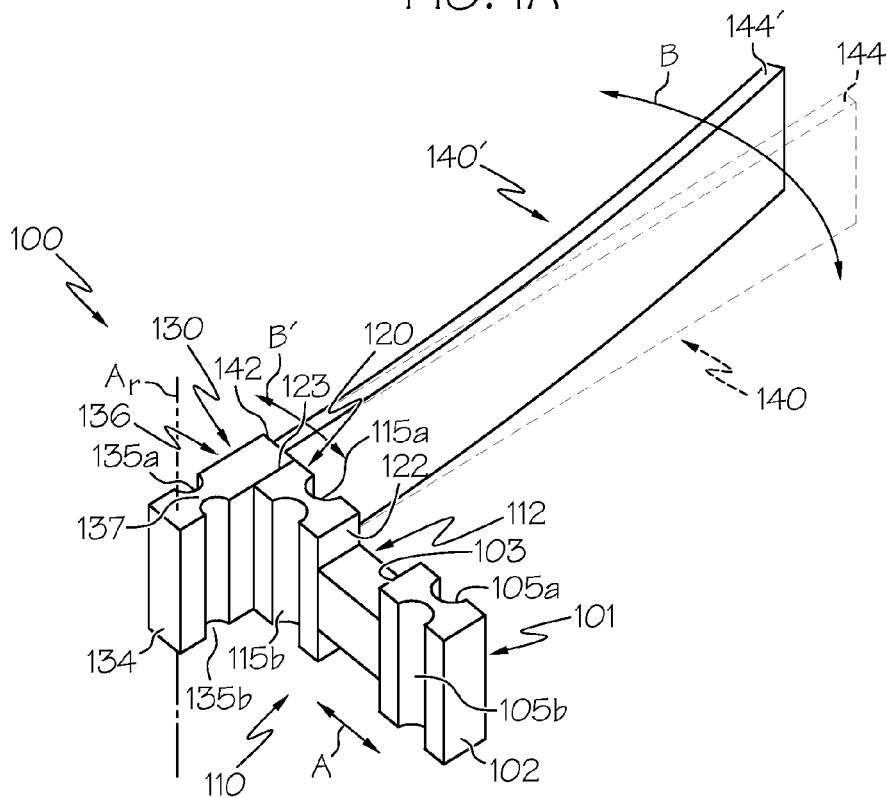
FIG. 1B schematically depicts motion of the cooling apparatus depicted in FIG. 1A according to one or more embodiments shown and described herein.

Referring now to FIG. 1B, the cooling apparatus 100 depicted in FIG. 1A is schematically illustrated without the magnetic field generating device 110 to illustrate movement of the second end of the fan member 140 by actuation of the magnetic shape memory member 112. As described above, the magnetic shape memory member 112 acts as a linear actuator coupled to the second compliant member 130 that is further coupled to a fan member 140. The magnetic shape memory member 112 is actuated by a magnetic field generated by a magnetic field generating device 110 (see FIG. 1A). The magnetic field and the compliant mechanism defined by the first, second, and third compliant members 101, 120, 130 causes the magnetic shape memory member 112 to expand and contract along linear translation axis A such that the magnetic shape memory member 112 pushes against the actuated portion 136 of the second compliant member 130 via the third compliant member 120. The contraction of the magnetic shape memory member 112, along with the elastic restorative force of the second compliant member 130, pulls the actuated portion 136 back along the linear translation axis A. This action causes the actuated portion 136 of the second compliant member 130 to move (oscillate) about the axis of rotation $A_r$ defined by the fixed surface 134 of the second compliant member 130, as illustrated by arrow B'. The motion of the actuated portion 136 of the second compliant member 130 then causes coupled rotary blade motion of the second end 144 of the fan member 140, which generates airflow in a desired direction. This airflow may be directed at a heat generating device or secondary cooling device, such as a heat sink or a heat spreader, for example.

Embodiments of the cooling apparatus 100 may be configured such that the fan member oscillates at a particular resonant frequency to generate a desired airflow. The desired airflow may depend on the particular application in which the cooling apparatus is integrated. In one embodiment, the cooling apparatus 100 is designed to operate at a resonant frequency up to about 1000 Hz.

Figure 2:
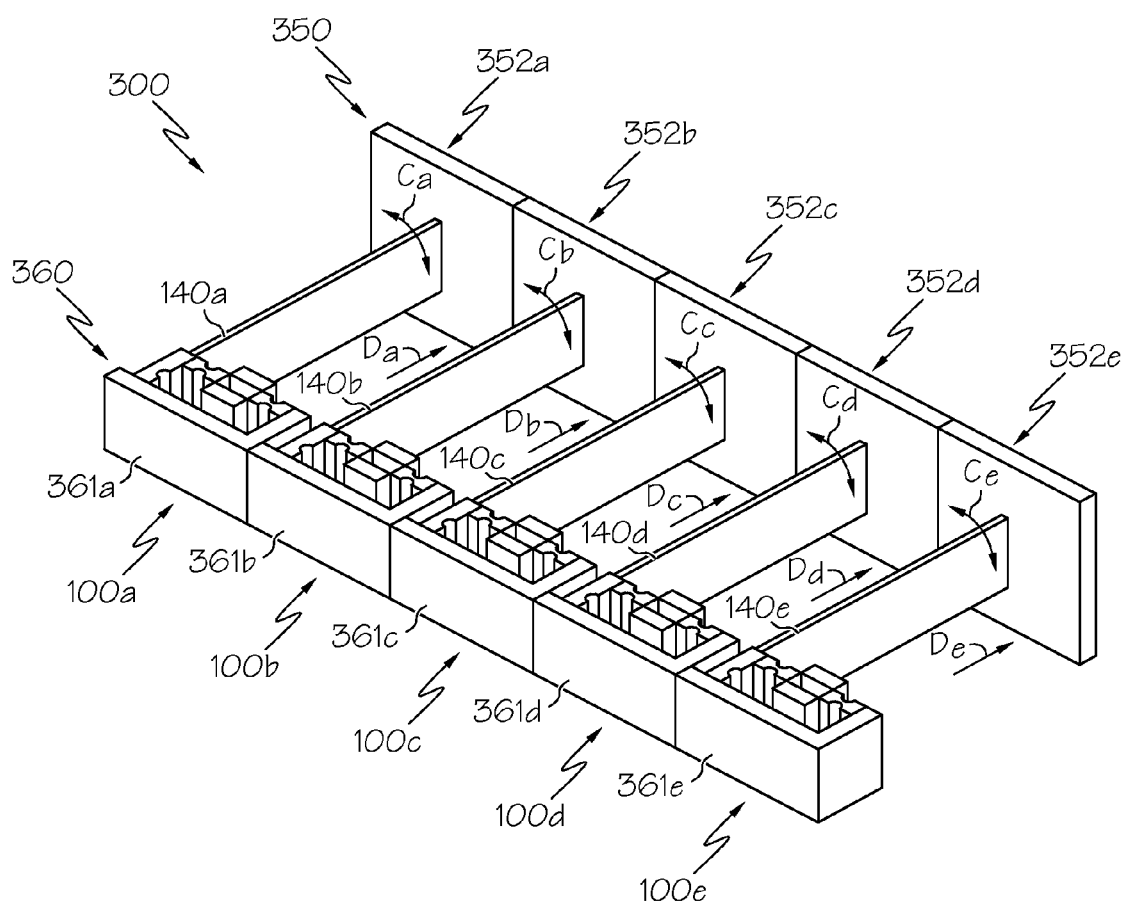
FIG. 2 schematically depicts an electronic device assembly comprising a plurality of cooling apparatuses according to one or more embodiments shown and described herein.

Embodiments of the cooling apparatus 100 may be incorporated into larger systems, such as a cooling assembly or system for an electronics package. FIG. 2 schematically depicts an electronic device assembly 300 comprising a plurality of cooling apparatuses 100a-100e arranged in a linear array and configured to produce airflow $D_a$-$D_e$ toward a heat generating device assembly 350, which may comprise several heat spreaders 352a-352e coupled to several heat generating devices (not shown). The heat generating devices may include, but are not limited to, semiconductor devices (e.g., power semiconductors) and motors. Embodiments are not limited to the generic heat generating device assembly 350 depicted in FIG. 2, and may include many additional components that are not illustrated, including, but not limited to, heat sink structures, liquid-cooling structures, additional heat spreaders, jet-impingement cooling structures, and the like. Additionally, the heat spreaders 352a-352e may be configured as a single heat spreader. Accordingly, there are many configurations that are possible for the heat generating device assembly. It should also be understood that embodiments may comprise a single cooling apparatus (e.g., 100a) and single heat generating device assembly (e.g., heat spreader 352a and various other components, such as a heat generating device).

In the illustrated embodiment, each cooling apparatus 100a-100e comprises a base portion 361a-361e to which the first compliant member 101 and the fixed surface 134 of the second compliant member 130 are coupled (see FIG. 1A). The base portion 361a-361e may be configured as an L-shaped, rigid mounting bracket. Other configurations are also possible. As shown in FIG. 2, the base portions 361a-361e are coupled together to form a cooling assembly comprised of a linear array of cooling apparatuses 100a-100e. The fan members 140a-140e of each cooling apparatus 100a-100e may be magnetically actuated as described above with respect to FIGS. 1A and 1B and depicted by arrows $C_a$-$C_e$ to generate an airflow (depicted as airflow lines $D_a$-$D_e$) toward the heat spreaders 352a-352e (or other components of the heat generating device assembly 350) to cool the heat generating device assembly 350 by convection. Such an electronic device assembly 300 may be incorporated into a larger electrical system, such as an inverter system of a hybrid electric or electric vehicle, for example.

Figure 3:
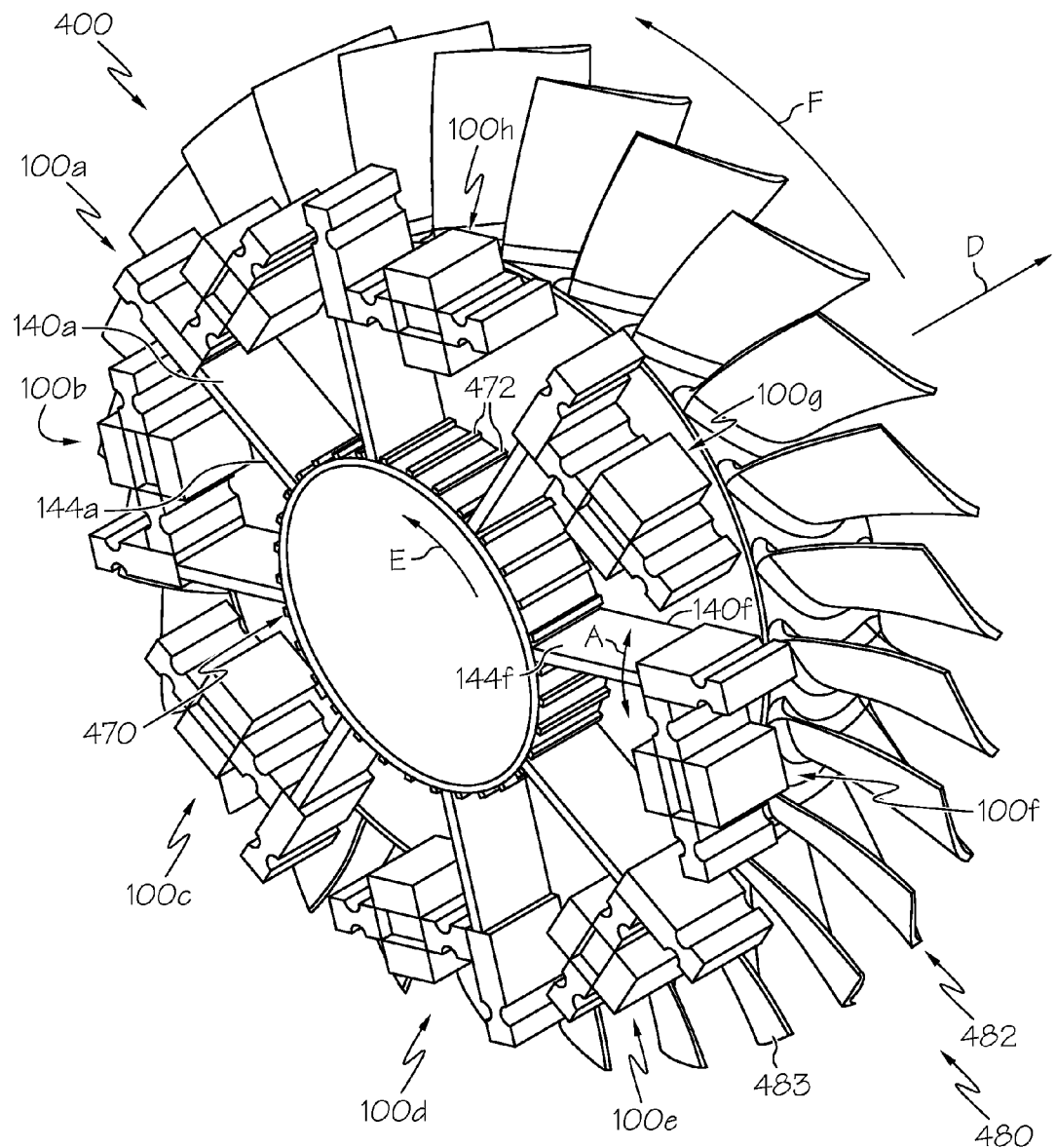
FIG. 3 schematically depicts a cooling assembly comprising a plurality of radially arranged cooling apparatuses, a gear member, and a propeller device according to one or more embodiments shown and described herein.

Referring now to FIG. 3, a cooling assembly 400 comprising a plurality of radially arranged cooling apparatuses 100a-100h coupled to a gear member 470 is schematically illustrated. The gear member 470 may be further coupled to a propeller device 480 by a drive shaft (not shown) such that rotary motion of the gear member 470 translates into rotary motion of the propeller device 480.

The gear member 470 comprises a plurality of gear teeth 472. The plurality of cooling apparatuses is arranged about the gear member 470 such that the fan member 140a-140h of each cooling apparatus 100a-100h extends radially inward toward the gear member 470. Each cooling apparatus 100a-100h may be coupled to a rigid surface to provide a support for the first compliant member and the fixed surface of the compliant member of each cooling apparatus 100a-100h. In another embodiment, each cooling apparatus is coupled to an intermediary base portion (not shown) between the plurality of cooling apparatuses and the propeller device 480.

The second end 144a-144h of each cooling apparatus 100a-100h engages the gear teeth 472 during movement of the fan member 140 via actuation of the magnetic shape memory member. More specifically, as the magnetic shape memory member (see FIGS. 1A and 1B) of each cooling apparatus 100a-100h expands, the second end 144a-144h of the fan member 140a-140h of each cooling apparatus 100a-100h contacts and pushes an individual tooth 472 of the gear member 470, which causes rotation of the gear member 470 as indicated by arrow E.

The gear member 470 is coupled to an actuated portion 482 of the propeller device 480 (e.g., one or more fan members 483 of the propeller device 480). The rotary motion of the gear member 470 is therefore translated into rotary motion of the actuated portion 482 of the propeller device 480 as indicated by arrow F. The rotation of the actuated portion 482 of the propeller device 480 creates airflow as indicated by arrow D. The magnetic shape memory members in the cooling apparatuses 100a-100h have large energy density and strain output that allows for implementation at the gear member 470, resulting in faster blade velocity of the propeller device 480.

It is noted that embodiments of the present disclosure are not limited to the actuated portion illustrated in FIG. 3, as the fan members of the actuated portion may come in a wide variety of configurations. The particular design of the actuated portion may depend on the cooling requirements of the heat generating device the cooling assembly is designed to cool. Further, the configuration of cooling apparatuses (or actuators, in some applications) may be used to drive a motor rather than fans to cool one or more heat generating devices. For example, the gear member 470 may be used to drive a motor or other mechanical systems.

It should now be understood that embodiments described herein utilize a magnetic shape memory member as a linear actuator to oscillate a fan member using a compliant mechanism defined by several compliant members. The magnetic shape memory member is actuated by the application of a magnetic field. The ferromagnetic shape memory material (e.g., a Ni—Mn—Ga alloy) of the magnetic shape memory member has a high strain output and energy density. Further, ferromagnetic shape memory materials are known to have a response time that is faster than other actuators, such as temperature-induced shape memory materials (e.g., NiTi alloys). Cooling apparatuses having a magnetic shape memory member may be incorporated into electronic device assemblies, such as power electronics device assemblies. Several cooling apparatuses may be coupled together to increase airflow toward a heat generating device. In one embodiment, several cooling apparatuses may be radially arranged to drive a propeller device to cause airflow in a specified direction.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling apparatus comprising:
    a first compliant member comprising a fixed surface and a coupling surface;
    a magnetic shape memory member comprising a first end and a second end, the first end of the magnetic shape memory member coupled to the coupling surface of the first compliant member, wherein the magnetic shape memory member is configured to expand along a linear translation axis in response to a magnetic field;
    a second compliant member comprising a first surface and a second surface, wherein the first surface of the second compliant member is coupled to the second end of the magnetic shape memory member; and
    a fan member comprising a first end and a second end, wherein:
        the first end of the fan member is coupled to a base portion;
        the second end of the second compliant member is coupled to the fan member; and
        expansion of the magnetic shape memory member pushes the second compliant member and causes the second end of the fan member to translate about an axis defined by the first end of the fan member.

2. The cooling apparatus of claim 1, wherein the magnetic shape memory member comprises Ni—Mn—In—Co alloy.

3. The cooling apparatus of claim 1, wherein the magnetic shape memory member comprises a Ni—Mn—In—Co alloy.

4. The cooling apparatus of claim 1, wherein the magnetic shape memory member comprises a Ni—Fe—Ga—Co alloy.

5. The cooling apparatus of claim 1, wherein the first compliant member and the second compliant member each comprise a first groove and a second groove that is opposite from the first groove.

6. A cooling apparatus comprising:
    a first compliant member comprising a fixed surface and a coupling surface;
    a magnetic shape memory member comprising a first end and a second end, the first end of the magnetic shape memory member coupled to the coupling surface of the first compliant member, wherein the magnetic shape memory member is configured to expand along a linear translation axis in response to a magnetic field;
    a second compliant member comprising a fixed surface and an actuated portion, wherein expansion of the magnetic shape memory member causes the actuated portion to translate about an axis defined by the fixed surface of the second compliant member; and
    a fan member comprising a first end and a second end, wherein the first end of the fan member is coupled to the actuated portion of the second compliant member such that translation of the actuated portion translates the second end of the fan member.

7. The cooling apparatus of claim 6, further comprising a third compliant member comprising a first surface and a second surface, wherein the first surface of the third compliant member is coupled to the second end of the magnetic shape memory member and the second surface of the third compliant member is coupled to the actuated portion of the second compliant member, wherein the expansion of the magnetic shape memory member pushes the third compliant member and the actuated portion of the second compliant member to translate the second end of the fan member.

8. The cooling apparatus of claim 6, wherein the magnetic shape memory member comprises a Ni—Mn—Ga alloy.

9. The cooling apparatus of claim 6, wherein the magnetic shape memory member comprises a Ni—Mn—In—Co alloy.

10. The cooling apparatus of claim 6, wherein the magnetic shape memory member comprises a Ni—Fe—Ga—Co alloy.

11. The cooling apparatus of claim 6, wherein the first compliant member and the second compliant member each comprise a first groove and a second groove that is opposite from the first groove.

12. An electronic device assembly comprising:
a heat generating device; and
a cooling apparatus positioned proximate the heat generating device, the cooling apparatus comprising:
a first compliant member comprising a fixed surface and a coupling surface;
a magnetic shape memory member comprising a first end and a second end, the first end of the magnetic shape memory member coupled to the coupling surface of the first compliant member wherein the magnetic shape memory member is configured to expand along a linear translation axis in response to a magnetic field;
a second compliant member comprising a fixed surface and an actuated portion, wherein expansion of the magnetic shape memory member causes the actuated portion to translate about an axis defined by the fixed surface of the second compliant member, and the first and second compliant members define a compliant mechanism; and
a fan member comprising a first end and a second end, wherein the first end of the fan member is coupled to the actuated portion of the second compliant member such that translation of the actuated portion translates the second end of the fan member to generate an airflow toward the heat generating device.

13. The electronic device assembly of claim 12, wherein the cooling apparatus further comprises a third compliant member comprising a first surface and a second surface, wherein the first surface of the third compliant member is coupled to the second end of the magnetic shape memory member and the second surface of the third compliant member is coupled to the actuated portion of the second compliant member, wherein the expansion of the magnetic shape memory member pushes the third compliant member and the actuated portion of the second compliant member to translate the second end of the fan member.

14. The electronic device assembly of claim 12, wherein the magnetic shape memory member comprises a Ni—Mn—Ga alloy.

15. The cooling apparatus of claim 12, wherein the magnetic shape memory member comprises a Ni—Mn—In—Co alloy.

16. The cooling apparatus of claim 12, wherein the magnetic shape memory member comprises a Ni—Fe—Ga—Co alloy.

17. The electronic device assembly of claim 12, further comprising one or more additional cooling apparatuses, wherein the cooling apparatus and the one or more additional cooling apparatuses are linearly arranged to generate the airflow toward the heat generating device upon actuation of the magnetic shape memory member of the cooling apparatus and the one or more additional cooling apparatuses.

18. The electronic device assembly of claim 17, wherein the cooling apparatus and the one or more additional cooling apparatuses each comprise a mounting bracket, wherein the fixed surface of the first and second compliant members are coupled to a respective mounting bracket.

19. The electronic device assembly of claim 12, further comprising a heat spreader coupled to a surface of the heat generating device.

20. The electronic device assembly of claim 12, further comprising:
a gear member comprising a plurality of gear teeth;
a propeller device rotatably coupled to the gear member;
a plurality of additional cooling apparatuses, wherein:
the cooling apparatus and the plurality of additional cooling apparatuses are arranged such that fan members of the cooling apparatus and the plurality of additional cooling apparatuses extend radially inward toward the gear member;
the second end of each fan member contacts the plurality of gear teeth as the magnetic shape memory member actuated; and
the expansion of the magnetic shape memory member of the cooling apparatus and the plurality of additional cooling apparatuses cause the second end of the fan members to push on individual ones of the plurality of gear teeth, thereby rotating the gear member and an actuated portion of the propeller device to generate the airflow toward the heat generating device.

* * * * *